United States Patent [19]
Mimotogi et al.

[11] Patent Number: 5,876,885
[45] Date of Patent: Mar. 2, 1999

[54] PROFILE SIMULATION METHOD, DEPENDENT ON CURVATURE OF PROCESSED SURFACE, AND MASK DESIGN METHOD UTILIZING SIMULATION

[75] Inventors: Shoji Mimotogi; Soichi Inoue; Akiko Mimotogi, all of Yokohama, Japan

[73] Assignee: Kabushiki Kaisha Toshiba, Kawasaki, Japan

[21] Appl. No.: 686,703

[22] Filed: Jul. 25, 1996

[30] Foreign Application Priority Data

Jul. 26, 1995 [JP] Japan .................................. 7-190124

[51] Int. Cl.$^6$ ....................................................... G03F 9/00
[52] U.S. Cl. .................................. 430/30; 430/5; 430/331
[58] Field of Search .................. 430/30, 331, 5

[56] References Cited

PUBLICATIONS

E. Barouch, et al. "Resist Development Described By Least Action Principle–Line Profile Prediction", J. Vac. Sci. Technol. B6, (pp. 2234–2237), Nov./Dec. 1988.

Masato Fujinaga, et al. "Three–Dimensional Topography Simulation Model: Etching and Lithography", IEEE Transactions on Electron Devices, vol. 37. No. 10, (pp. 2183–2192), Oct. 1990.

Masaya Komatsu. "Three Dimensional Resist Profile Simulation", SPIE, vol. 1927 Optical/Laser Microlithography VI (pp. 413–426), Feb. 1993.

*Primary Examiner*—Christopher G. Young
*Attorney, Agent, or Firm*—Oblon, Spivak, McClelland, Maier & Neustadt, P.C.

[57] ABSTRACT

The profile simulation method of predicting a processed profile of a surface of a substrate to be changed by physically or chemically processing a film on the substrate to be processed comprises a step of changing a processing speed in correspondence with a convex portion and a recessed portion of the film on the substrate.

12 Claims, 4 Drawing Sheets

(a) Ma = 0.44 μm, Mb = 1.1 μm
(b) Ma = 0.50 μm, Mb = 1.1 μm
(c) Ma = 0.54 μm, Mb = 1.1 μm

PROFILE SIMULATION METHOD, DEPENDENT ON CURVATURE OF PROCESSED SURFACE, AND MASK DESIGN METHOD UTILIZING SIMULATION

BACKGROUND OF THE INVENTION

1. Field of the Invention

The present invention relates to a profile simulation method for predicting a processed profile obtained by development, etching, or the like, and to a mask design method and a mask design apparatus for designing an exposure mask with use of the simulation method.

2. Description of the Related Art

In a case of manufacturing a semiconductor element and the like by lithography steps, an image of a mask pattern is projected onto a wafer coated with a resist, and thereafter, the wafer is subjected to development, to form a resist pattern. For example, in a case of a positive tone resist, the resist of the portion where the exposure is great is dissolved by a developer, thereby forming a resist pattern.

The resist pattern obtained after the development varies depending on defocus conditions, exposure conditions (e.g., a numerical aperture, a coherence factor, a light source shape, a pupil filter, and the like), a development time, and a mask pattern.

Therefore, a great number of exposure experiments must be carried out in order to obtain conditions and a mask pattern in a projection optical system used for finishing a desired pattern which has a predetermined depth of focus, from experiments. Hence, it is desirable to carry out a simulation using a computer, to obtain conditions in which the resist profile after development has an optimal condition.

Thus, a method of predicting a resist profile after development has been known as a resist profile simulation. Various methods have been proposed as a conventional resist profile simulation method. In the following, those methods will be briefly explained.

There is a string model in which the profile of a resist is expressed as a sequence of fine line segments in a case of dealing with only two-dimensional profiles, while the profile of a resist is expressed as a sequence of fine area segments in a case of dealing with a three-dimensional profile. In this string model, the direction in which fine line segments or area segments are moved is a direction vertical to the surface. In contrast, a method of obtaining a moving direction with use of a differential equation to solve a similar differential equation is called a ray-tracing model.

There is known a cell model as a method in which an object is divided into an aggregate of fine cells and a change in profile is expressed by elimination or adhesion of cells on the surface of the object. In addition, there is a distribution function method in which the profile of an object is expressed as an equivalent area of a distribution function and a differential equation similar to a diffusion equation is solved to obtain a time-based change of the profile.

Further, as a simplified method, there is a simplified development model. In this simplified development model, the development processing is arranged such that an aggregate of end points is the profile after development, supposing that the development proceeds in a direction vertical to the substrate from a start point which is the point on the resist surface where the solution speed is fastest, that the development then proceeds in a direction parallel to the substrate from the point where the development has proceeded for a certain distance, and that the developing direction is changed at all the points vertical to the substrate.

However, these kinds of methods include the following problems. Specifically, in the conventional techniques as described above, the solution speed of resist does not depend on the profile of the portion to be dissolved, but depends on only the photo-sensitive characteristics and processing conditions.

For example, in a case of developing a hole pattern, the amount of resist to be dissolved by a developer for a unit volume in a hole is large, so that the solution speed is extremely reduced. Regardless of the extremely reduced solution speed, the simulation is performed with use of a solution speed equal to a solution speed used for a flat resist profile as supposed in exposure of an entire surface. Therefore, in a hole pattern, the resist profile actually obtained is different from the profile as a simulation result.

In addition, ends of a pattern and a bent portion thereof lead to problems in a case of using an equal solution speed, in addition to the hole pattern. In these portions, the amount of resist to be dissolved by a developer for a unit volume is larger (or smaller) than in the other portions, and the solution speed changes accordingly, so that a simulation result different from an exposure result is obtained.

Meanwhile, a mask pattern is not completely equal to a resist pattern actually finished, and therefore, a mask must be designed estimating the mask to be actually finished, in order to obtain a desired resist pattern. In this case, it is not possible to design a mask with a high accuracy if the actual profile is different from a profile obtained by performing a simulation as described above. Therefore, the procedures are very complicated since it is necessary to actually perform exposure, observe a resist pattern finished by development with use of an electronic microscope, correct the mask pattern in accordance with the observation result, and repeat performing experiments until a desired pattern is obtained.

Thus, in conventional profile simulation methods, there is a problem that a pattern actually obtained is different from a simulation result in the regions of ends and a bent portion of a pattern. In addition, an experiment consisting of a series of exposure, development, observation, and correction must be repeated in order to perform accurate mask designing, and the procedures are thus complicated.

SUMMARY OF THE INVENTION

The present invention has an object of providing a profile simulation method which is capable of accurately predicting a given processed profile.

The present invention has another object of providing a mask design method and a mask design apparatus in which a mask for obtaining a desired resist pattern can be easily designed with use of the simulation method as described above when designing a mask used for exposing a photosensitive film on a substrate in a desired pattern.

In order to achieve the above objects, the present invention adopts the structure as described below.

The profile simulation method according to the present invention is used to predict a processed profile of a surface of a substrate to be changed by physically or chemically processing a film on the substrate to be processed, and comprises a step of changing a processing speed in correspondence with a convex portion and a recessed portion of the film on the substrate.

Embodiments of the present invention will be practiced as follows.

(1) The step of changing the processing speed includes a sub-step of changing a processing speed with respect to a convex portion and a recessed portion of the film, in correspondence with an area of a surface to be processed by a unit volume of processing material.

(2) The processing material is a developer, an etching solution, or an etching gas.

(3) The film is a photo-sensitive film, the profile of the film processed in an arbitrary processing time is represented by an equivalent surface of a latent image intensity or a sensitive material density.

The mask design method according to the present invention is used to design a mask used for exposing a photo-sensitive film on a substrate in a desired pattern, and comprises steps of: exposing the photo-sensitive film with use of the mask having a predetermined pattern, by profile simulation methods as described above, thereby to obtain a processed profile when development is performed; and correcting a pattern profile of a mask in correspondence with a difference between the processed profile obtained by the step of exposing the photo-sensitive film, and a desired profile.

The mask design apparatus is used to design a mask used for exposing a photo-sensitive film on a substrate in a desired pattern, and comprises: memory means for storing a mask having a predetermined pattern; a processed profile estimating section for exposing the photo-sensitive film with use of the mask having a predetermined pattern, in accordance with profile simulation methods as described above, thereby to obtain a processed profile when development is performed; and a correcting section for correcting a pattern profile of a mask in correspondence with a difference between the processed profile obtained by the processed profile estimating section and a desired profile.

According to the present invention, since the processing speed is changed in correspondence with the profile of the surface to be processed and particularly in correspondence with a convex portion and a recessed portion of a surface to be processed, when the profile of the film on the substrate to be processed is simulated, it is possible to predict a finished profile after processing, with a high accuracy, even at an end of a pattern and at a bent portion thereof. Further, since this method is applied to mask designing, it is possible to easily design a mask from which a desired pattern is obtained, without experimentally repeating actual exposure and development.

As described above, according to the present invention, the resist profile after development can be calculated with a very high accuracy, and it is possible to easily obtain exposure conditions and a mask pattern required for finishing a desired pattern which will have a predetermined processing margin.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENTS

In the following, embodiments of the present invention will be explained with reference to the drawings.

With use of FIGS. 1 to 7C, the resist profile simulation method according to the first embodiment of the present invention will be explained.

Figure 1:
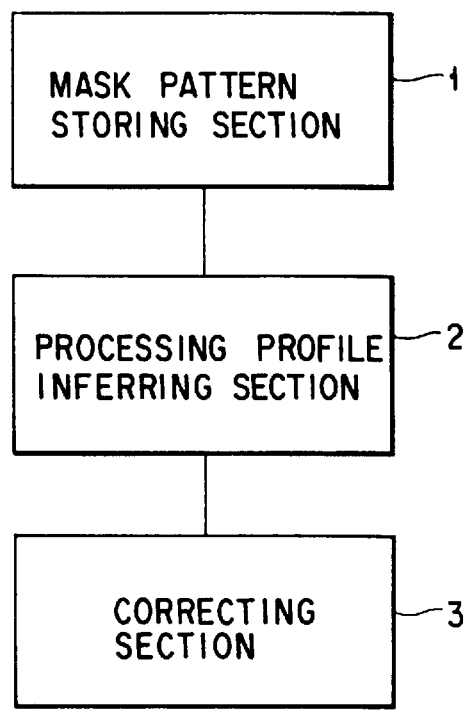
FIG. 1 is a schematic block diagram showing a mask design apparatus according to the present invention.

FIG. 1 is a block diagram showing a schematic structure of the mask design apparatus according to the present invention.

The mask design apparatus of the present invention comprises a mask pattern storing section 1 for storing a mask having a predetermined pattern, a processing profile inferring section 2 for obtaining a processed profile where a film (e.g., a photosensitive film) to be processed is subjected to exposure/development with use of the mask, and a correcting section 3 for correcting the pattern profile of the mask in correspondence with a difference between the processing profile obtained by the processed profile inferring section 2 and a desired profile.

A simulation method of a specific resist profile using the apparatus of the present invention will be explained below.

Figure 2A:
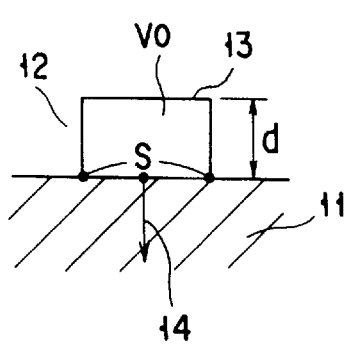
FIGS. 2A to 2C are views for explaining a resist profile simulation method according to a first embodiment and show convex and recessed portions of a resist approximated by a spherical surface or a column having a fine surface area S.
Figure 2B:
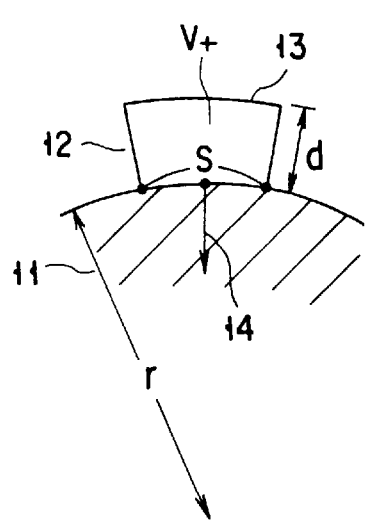
Figure 2C:
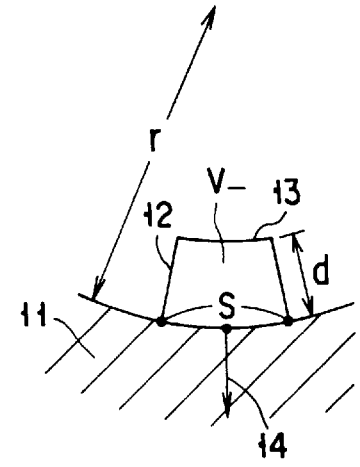

As shown in FIGS. 2A to 2C, in a resist formed on a substrate, convex and recessed portions of the resist profile on the substrate surface are approximated by a spherical surface (or a column) having a fine surface area S, and the radius thereof is set to r. FIG. 2A shows a case where r=∞ is satisfied and where flat exposure such as exposure of an entire surface or a line pattern such as a line and a space are performed. FIG. 2B shows a case where a portion of a resist to be dissolved is a convex portion. FIG. 2C shows a case where a portion of a resist to be dissolved is a recessed portion.

Here, FIGS. 2A to 2C show a resist 11, a developer 12, a developer 13 contacting to a unit surface area of resist, and a solution direction 14.

Note that "convex and recessed portions of a substrate surface" respectively mean the outside of a bent portion of a pattern and the inside thereof, for example. More specifically, in a pattern shown in FIG. 3, a portion A is flat and corresponds to FIG. 2A, a portion B is a convex portion and corresponds to FIG. 2B, and a portion C is a recessed portion and corresponds to FIG. 2C.

The solution speed of a portion of resist to be dissolved is in inverse proportion to the surface area of resist contacting to a unit developer amount. In other words, the solution speed is proportional to the developer amount contacting to a unit surface area of resist. Therefore, the solution speed in three cases shown in FIGS. 2A to 2C is expressed as follows.

$$R \times f(r) \quad (1)$$

Here, f(r) varies in correspondence with the profile of the portion of resist to be dissolved.

$$f(r) = \begin{cases} 1 + \alpha/r & : \text{convex surface} \\ 1 & : \text{flat surface} \\ 1 - \alpha/r & : \text{recessed surface} \end{cases} \quad (2)$$

In the equation (2), R is an exposure condition and a solution speed decided by photosensitive characteristics of resist and processing conditions. In addition, α is a adjustment parameter. Supposing that a positive curvature is obtained where a portion to be dissolved is a convex portion and a negative curvature is obtained where a potion to be dissolved is a recessed portion, f(r) is expressed as follows.

$$f(r)=1+\alpha/r \quad (3)$$

Depending on mask patterns, there is a case in which the radius r is extremely small and f(r) becomes negative. Therefore, cutting-off is carried out at a certain value of r. Where the cutting-off radius is rmin, the followings are obtained.

$$f(r)=1+\alpha/r (|r|>\text{rmin}) \quad (4a)$$

$$f(r)=1+\alpha/\text{rmin} (|r|<\text{rmin}) \quad (4c)$$

Figure 3:
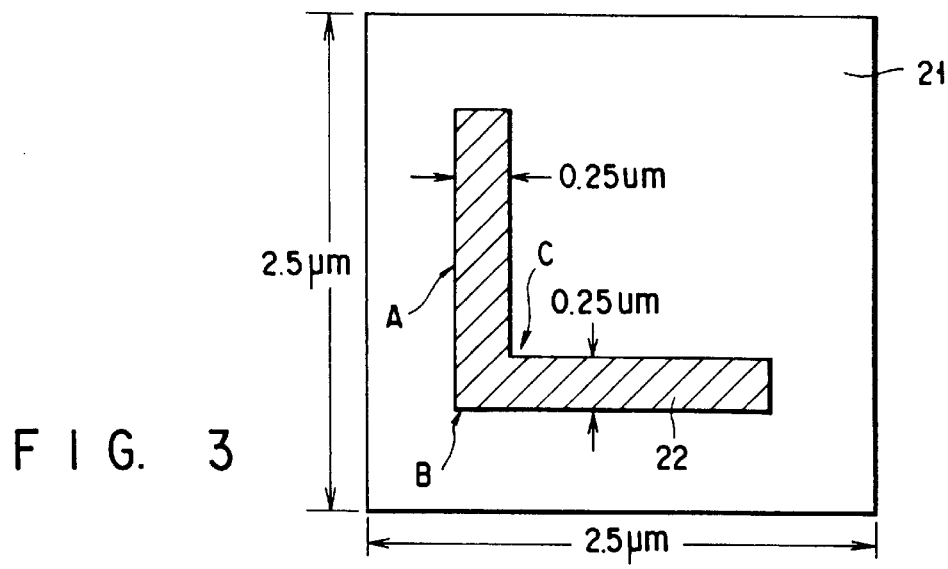
FIG. 3 is a view showing an example of a mask pattern used in a first embodiment.
Figure 4:
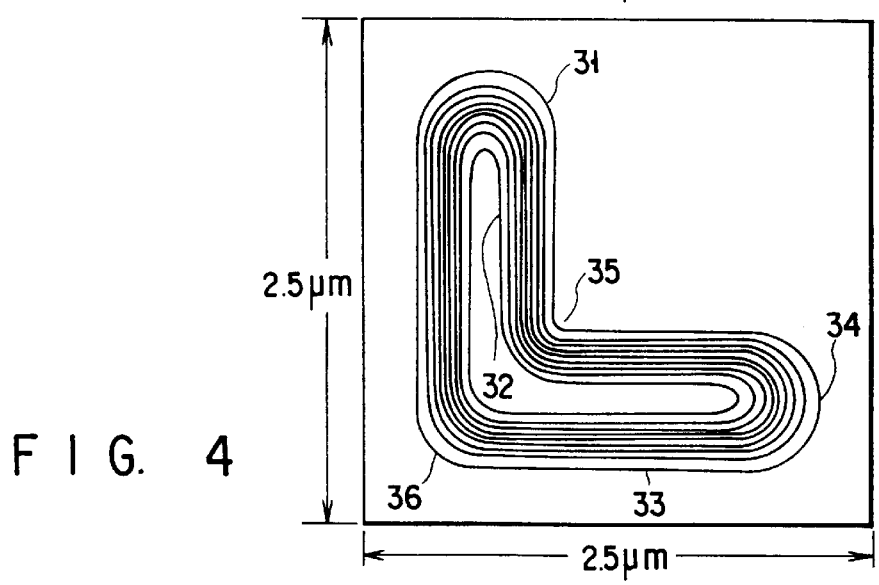
FIG. 4 is a view showing an optical image depending on a mask pattern used in the first embodiment.

FIG. 4 shows a result in which averages obtained by averaging a distribution of a latent image in a resist film in a direction vertical to the substrate surface are expressed by contours where exposure is performed with use of the mask pattern shown in FIG. 3. The exposure conditions are arranged such that λ=248 nm, NA=0.5, σ=0.5, and ε=0.67, at a best focus position. Note that FIG. 3 shows a mask aperture portion 21 and a mask shielding portion 22. FIG. 4 shows the highest contour 31, the lowest contour 32, convex portions 34 and 36, and a recessed portion 35.

A half-tone phase shifter having an intensity aperture rate 6% is used for the mask shielding portion 22. In the vicinity of a flat portion 33 in FIG. 4, an equation of r=∞ exists. In the vicinity of convex potions 34 and 36, a relation of r>0 exists. In the vicinity of a recessed portion 35, a relation of r<0 exists.

Figure 5:
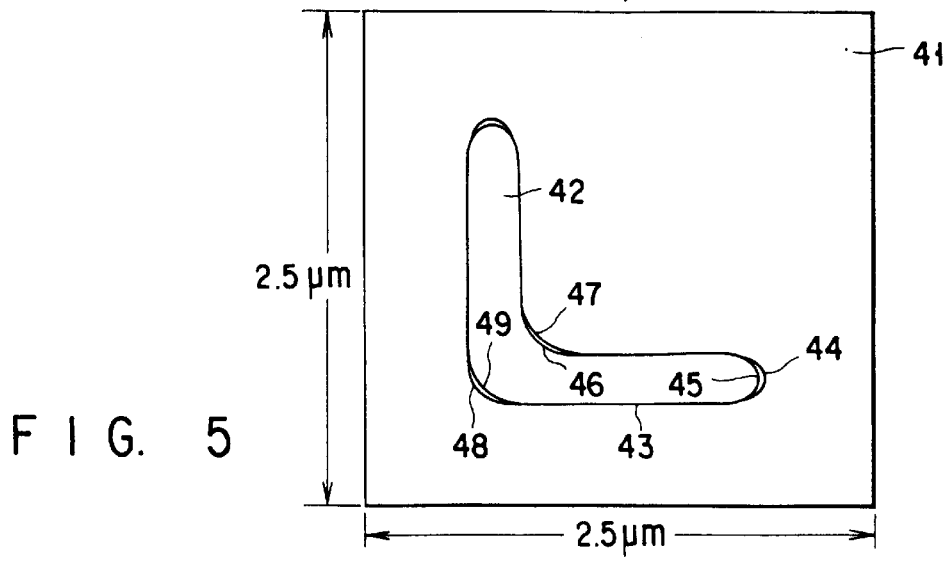
FIG. 5 is a view showing a resist profile after development in the first embodiment.

The resist profile after development is shown in FIG. 5. Using the curvature radius of the contour obtained by the optical image of FIG. 4 is used as r in the equations of (4a) and (4b), to perform a calculation of the resist profile after development. A result obtained by a conventional method is shown overlapped thereon. In FIG. 5, the reference 41 indicates a solved portion of resist, the reference 43 indicates a remain portion of resist, the reference 45 indicates a portion where a result of the present invention overlaps a result of a conventional method, the references 44, 46, and 48 denote results obtained by a conventional method, and the references 45, 47, and 49 denote results obtained by the present invention. In the vicinity of 43, the curvature of an optical image is zero and corresponds to the result of a conventional method. However, in the vicinity of 44 and 48, the remain portion in the result of the present invention is smaller in correspondence with a relation of r>0. In contrast, in the vicinity of 46, the remain portion is larger in correspondence with a relation of r<0.

Figure 6:
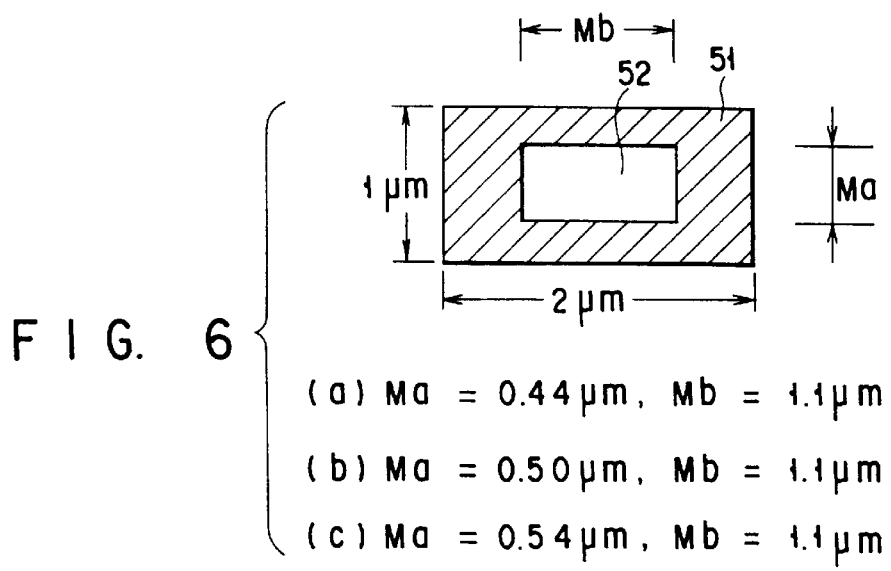
FIG. 6 is a view showing an example of a mask pattern in the first embodiment.

Effects of the resist profile calculation method according to the present embodiment will be explained with reference to FIGS. 6 to 7C. FIGS. 7A to 7C show comparison results between a calculation result and an experimental result where exposure is performed with use of the mask pattern shown in FIG. 6. FIG. 6 shows a mask shielding section 51 and a mask aperture section 52. FIGS. 7A to 7C respectively show experimental results in which the longer edge Mb of a mask aperture section 52 having a rectangular profile is maintained at a constant value (e.g., 1.1 μm) while the shorter edge Ma is variously set to 0.44 μm, 0.5 μm, and 0.54 μm. In each of these figures, A and B respectively correspond to the shorter and longer edges.

Figure 7A:
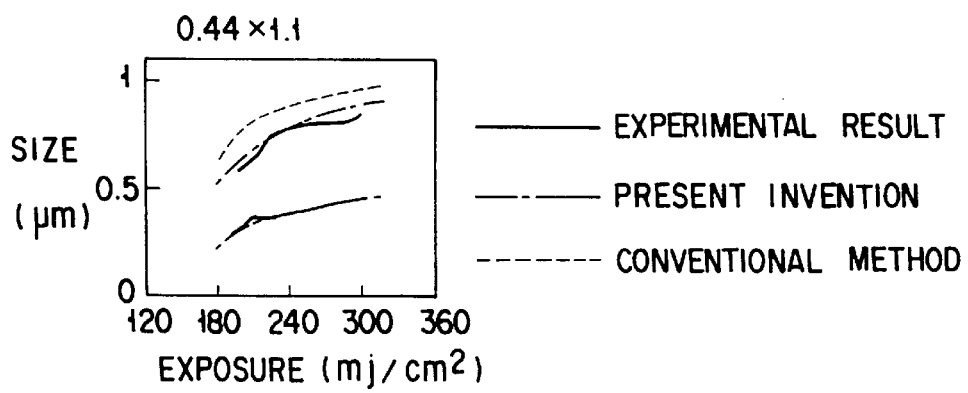
FIGS. 7A to 7C are views in which a calculation result and an experiment result are compared with each other when forming a pattern with use of the mask pattern shown in FIG. 6.
Figures 7B, 7C:
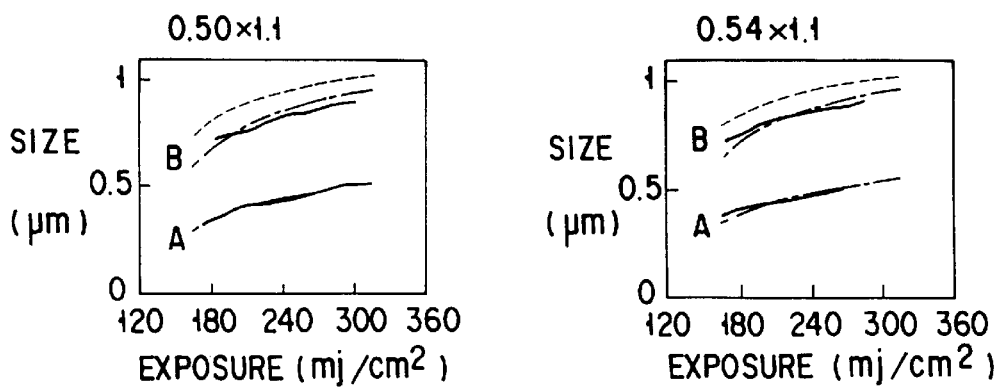

From FIGS. 7A to 7C, it is apparent that there is a large difference between the experimental result and an aimed pattern at those portions where the aimed pattern dimension is large, in a conventional method. However, in the method according to the present embodiment, the aimed pattern excellently corresponds to the experimental result at any portions.

As described above, according to the first embodiment, convex and recessed portions of the substrate surface in the resist solution surface are taken into consideration when the resist profile on a substrate is simulated, and the virtual solution speed is changed in accordance with the amount of a developer contacting to a unit surface area of resist. Therefore, it is possible to avoid an incorrespondence between the profile actually obtained and the simulation result, and to predict a finished profile after development at a high accuracy.

Figure 8:
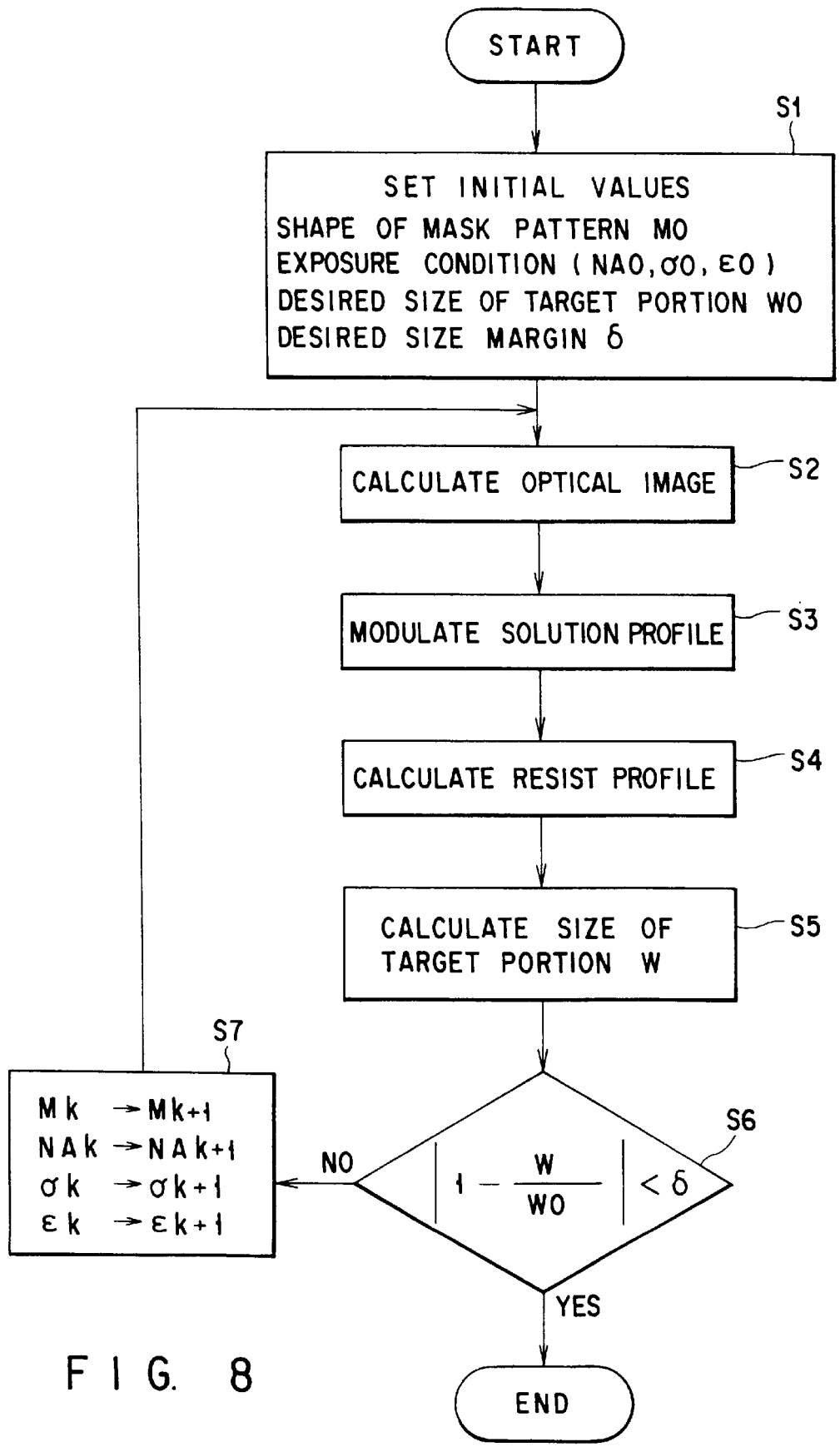
FIG. 8 is a flow-chart for explaining a mask design method according to a second embodiment.

The mask design method according to a second embodiment of the present invention will be explained with reference to FIG. 8.

That portion within a desired mask pattern which is limited in the procedure of device formation is supposed as a target portion. In order to finish the target portion in desired dimensions, optimal values are obtained with respect to mask conditions such as a mask bias, an auxiliary pattern, and the type of a mask (e.g., a chrome mask, a half-tone phase shift mask, a Levenson type phase shift mask, or the like) are obtained, and further, with respect to exposure conditions such as a numerical aperture NA, a coherence factor σ, a light source profile ε. A desired size of the target portion is expressed as w0 and the margin thereof is expressed as δ.

Initial values are set for an appropriate mask condition M0 and appropriate exposure conditions NA0, σ0, and ε0 (in a step S1), and an optical image distribution I (x, y, z) in the resist film is calculated under these conditions (in a step S2). Further, a solution speed distribution R (x, y, z) is obtained from the solution speed characteristic R (E) in case of exposure of an entire surface, and then, the solution speed is modulated in accordance with the curvature of an equivalent surface of the optical image (in a step S3).

In the next, a modulated solution speed R' (x, y, z) is used to calculate the profile of resist after development (in a step S4). A finished size w of the target portion is obtained (in a step S5), and is compared with a desired size w0 (in a step S6). When the difference between the finished size w of the target portion and the desired size w0 is within a size margin δ, the calculation is completed. Otherwise, the mask condition M and the exposure conditions NA, σ, and ε are changed (in a step S7), and then, the calculation processing from the step S2 is repeated.

As has been described above, in the present embodiment, it is possible to accurately obtain mask conditions and exposure conditions required for finishing a predetermined resist pattern. Further, according to the present invention, since it is not necessary to perform actually perform exposure, to observe a finished resist pattern by an electron microscope, or to repeat experiments until a predetermined pattern is obtained, like in a conventional method, it is possible to easily design a mask for obtaining a desired pattern.

Note that the present invention is not limited to the embodiments as described above.

In the above embodiments, solution development of a resist in optical lithography. However, the present invention is not limited to optical lithography, but is applicable to solution development of resist, e.g., electron beam lithography or X-ray lithography in which the relationship between the beam intensity and the solution speed is known.

Although the above embodiments have been explained supposing that the processing material used for formation of a resist pattern is a developer, the present invention is applicable not only to formation of a resist pattern but also to pattern formation depending on selective etching. In this case, the processing material may be an etching solution or an etching gas.

In addition, the present invention can be variously modified in practical use without deviating from the subject matter of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A profile simulation method of predicting a processed profile of a surface of a substrate which is changed by physically or chemically processing a film on the substrate to be processed, said method comprising a step of changing a processing speed in correspondence with a curvature of a processed surface according to the equation $$f(r) = \begin{cases} 1 + \alpha/r: \text{convex surface} \\ 1 \quad\quad\quad : \text{flatsurface} \\ 1 - \alpha/r: \text{recessed surface} \end{cases}$$

where r is a radius of the curvature and $\alpha$ is an adjustment parameter.

2. A mask design method of designing a mask used for exposing a photo-sensitive film on a substrate in a desired pattern, comprising steps of:

exposing the photo-sensitive film with use of the mask having a predetermined pattern, by a simulation method according to claim 1, thereby to obtain a processed profile when development is performed; and correcting a pattern profile of a mask in correspondence with a difference between the processed profile obtained by the step of exposing the photo-sensitive film, and a desired profile.

3. A profile simulation method according to claim 1, wherein the processing material is one of a developer, an etching solution, and an etching gas.

4. A mask design method of designing a mask used for exposing a photo-sensitive film on a substrate in a desired pattern, comprising steps of:

exposing the photo-sensitive film with use of the mask having a predetermined pattern, by a simulation method according to claim 3, thereby to obtain a processed profile when development is performed; and correcting a pattern profile of a mask in correspondence with a difference between the processed profile obtained by the step of exposing the photo-sensitive film, and a desired profile.

5. A profile simulation method according to claim 1, wherein the film is a photo-sensitive film, and the profile of the film processed in an arbitrary processing time is represented by an equivalent surface of one of a latent image intensity and a sensitive material density.

6. A mask design method of designing a mask used for exposing a photo-sensitive film on a substrate in a desired pattern, comprising steps of:

exposing the photo-sensitive film with use of the mask having a predetermined pattern, by a simulation method according to claim 5, thereby to obtain a processed profile when development is performed; and correcting a pattern profile of a mask in correspondence with a difference between the processed profile obtained by the step of exposing the photo-sensitive film, and a desired profile.

7. A profile simulation method according to claim 1, wherein the step of changing the processing speed includes a sub-step of changing a processing speed with respect to a convex portion and a recessed portion of the film, in correspondence with an area of a surface to be processed by a unit volume of processing material.

8. A mask design method of designing a mask used for exposing a photo-sensitive film on a substrate in a desired pattern, comprising steps of:

exposing the photo-sensitive film with use of the mask having a predetermined pattern, by a simulation method according to claim 7, thereby to obtain a processed profile when development is performed; and correcting a pattern profile of a mask in correspondence with a difference between the processed profile obtained by the step of exposing the photo-sensitive film, and a desired profile.

9. A profile simulation method according to claim 7, wherein the processing material is one of a developer, an etching solution, and an etching gas.

10. A mask design method of designing a mask used for exposing a photo-sensitive film on a substrate in a desired pattern, comprising steps of:

exposing the photo-sensitive film with use of the mask having a predetermined pattern, by a simulation method according to claim 9, thereby to obtain a processed profile when development is performed; and correcting a pattern profile of a mask in correspondence with a difference between the processed profile obtained by the step of exposing the photo-sensitive film, and a desired profile.

11. A profile simulation method according to claim 7, wherein the film is a photo-sensitive film, and the profile of the film processed in an arbitrary processing time is represented by an equivalent surface of one of a latent image intensity and a sensitive material density.

12. A mask design method of designing a mask used for exposing a photo-sensitive film on a substrate in a desired pattern, comprising steps of:

exposing the photo-sensitive film with use of the mask having a predetermined pattern, by a simulation method according to claim 11, thereby to obtain a processed profile when development is performed; and correcting a pattern profile of a mask in correspondence with a difference between the processed profile obtained by the step of exposing the photo-sensitive film, and a desired profile.

* * * * *